United States Patent [19]

Barroue et al.

[11] Patent Number: 5,424,738
[45] Date of Patent: Jun. 13, 1995

[54] ANALOG-DIGITAL ENCODING CIRCUIT WITH AUTOMATIC COMPENSATION FOR THE ZERO OFFSET

[75] Inventors: Thierry Barroue, Suresnes; Olivier Carl, Briis Sous Forge, both of France

[73] Assignee: Thomson-CSF, Puteaux, France

[21] Appl. No.: 124,208

[22] Filed: Sep. 21, 1993

[30] Foreign Application Priority Data

Sep. 25, 1992 [FR] France .................. 92 11451

[51] Int. Cl.$^6$ .................................. H03M 1/06
[52] U.S. Cl. .................... 341/118; 341/120
[58] Field of Search ............ 341/118, 155, 120

[56] References Cited

U.S. PATENT DOCUMENTS

| Re. 34,428 | 11/1993 | George et al. ........... 341/118 |
| 3,982,241 | 9/1976 | Lipcon ............... 341/118 |
| 4,251,803 | 2/1981 | Debord et al. ........... 341/118 |
| 4,390,864 | 6/1983 | Ormond ............... 341/166 |
| 4,468,651 | 8/1984 | Lechner et al. ........... 341/120 |
| 4,608,553 | 8/1986 | Ormond ............... 341/166 |
| 4,907,165 | 3/1990 | Toda . | |

FOREIGN PATENT DOCUMENTS

0466329A2 1/1992 European Pat. Off. .
0483846A2 5/1992 European Pat. Off. .
2396463 1/1979 France .

OTHER PUBLICATIONS

Patent Abstracts of Japan vol. 13, No. 195 Jan. 19, 1989 (E-754) (3543).

*Primary Examiner*—Marc S. Hoff
*Attorney, Agent, or Firm*—Oblon, Spivak, McClelland, Maier, & Neustadt

[57] ABSTRACT

This analog-digital coding circuit comprises, in parallel on an analog-digital converter, a crossover detector. This crossover detector operates on the input analog signal of the converter and, by means of a delay circuit, taking account of the conversion time of the converter, commands the recording of values in a digital register placed at output of the converter. A digital subtractor, placed at output of the coding circuit, makes a systematic deduction, from the digital values delivered by the converter, of that value which is memorized in the digital register and corresponds to the offset voltage of the converter.

4 Claims, 4 Drawing Sheets

ANALOG-DIGITAL ENCODING CIRCUIT WITH AUTOMATIC COMPENSATION FOR THE ZERO OFFSET

BACKGROUND OF THE INVENTION

1. Field of the Invention

The present invention relates to automatic compensation for the zero offset of an analog-digital converter used notably in a radar reception system with digital demodulation.

2. Field of the Prior Art

In a standard radar reception system, it is the usual practice to change to digital mode only at the demodulator outputs that give the components, in phase and quadrature, of the video signal. There are then two analog-digital converters parallel-connected to the outputs, in phase and in quadrature, of the demodulator in quadrature. The analog-digital converters as well as the demodulator in quadrature, which is made in analog form, have imperfections which make them generate parasitic d.c. components that evolve as a function of the variations in different parameters such as the temperature, the supply voltages and the frequency of the transmission carrier. It is the usual practice to remove these parasitic d.c. components by isolating them in the radar noise through a measurement of the mean values of the amplitudes of the output signals of the two analog-digital converters during a radar silence, this measurement being made for example on the furthest range gates reached after each transmission of an interrogation pulse for which the return of a significant echo is improbable, and by deducting these mean values from the output signals of the analog-digital converters.

A system such as this has at least two drawbacks: firstly, it calls for special digital circuits with a complex structure to carry out measurements of mean values on the noise of the radar at the output of the analog-digital converters and, secondly, it makes it necessary to have radar silence during the measurement period following the transmission of each interrogation pulse. This reduces the operational time of the radar and may be impossible to obtain in the presence of a jammer.

With the advances made in terms of the frequency of the analog-digital converters, it is possible, in a radar reception line, to replace the two analog-digital converters that work in the video band at the outputs of the demodulator in quadrature by a single analog-digital converter that works in intermediate frequencies and is placed at the input of the demodulator in quadrature which is itself made in digital form. In this case, the imperfections that arise from the analog type construction of the demodulator in quadrature are removed but, in the spectra of the video signal components in phase or in quadrature that are available at the output of the demodulator, there still remain parasitic d.c. components due to the zero offset of the analog/digital converter.

As in the foregoing case, it is possible to eliminate these parasitic d.c. lines by detecting their amplitudes through the computation of the mean values of the radar noise at the outputs, in phase and in quadrature, of the demodulator in quadrature during a radar silence, and by deducting them from the output signals, in phase and in quadrature, of the demodulator. However, the same drawbacks as above are found again, namely the need for digital circuits with a complex structure to take the mean values on the radar noise and the necessity of having periods of radar silence to make the measurements.

SUMMARY OF THE INVENTION

The present invention is aimed at overcoming the above-mentioned drawbacks and at making it possible to compensate for the offset voltage of an analog-digital converter at a lower cost.

It has, as its object, an analog-digital coding circuit with automatic compensation for the zero offset that works with an analog input signal having passages through zero (hereinafter called crossovers) and that furthermore comprises an analog-digital converter, with an analog data input and an digital data output, converting an input analog signal into a sequence of digital samples with a conversion time to;

- a crossover detector working on the input analog signal of the analog-digital converter and delivering an output binary signal, one state of which represents a crossover while the other state does not;
- a delay circuit positioned after the crossover detector, the output binary signal of which it delays by the conversion time to;
- a digital register with a digital data input connected to the digital data output of the analog-digital converter, a memorizing control input connected to the output of the delay circuit and sensitive to the binary state of this output signal representing a crossover, and a digital data output; and
- a digital subtractor with an additive input of digital data connected to the digital data output of the analog-digital converter, a subtractive input of digital data connected to the digital data output of the digital register, and a digital data output constituting the output of the analog/digital coding circuit.

BRIEF DESCRIPTION OF THE DRAWINGS

Other features and advantages of the invention shall appear from the following description of an embodiment given by way of an example. This description shall be made with reference to the appended drawings, wherein.

MORE DETAILED DESCRIPTION

Figure 1:
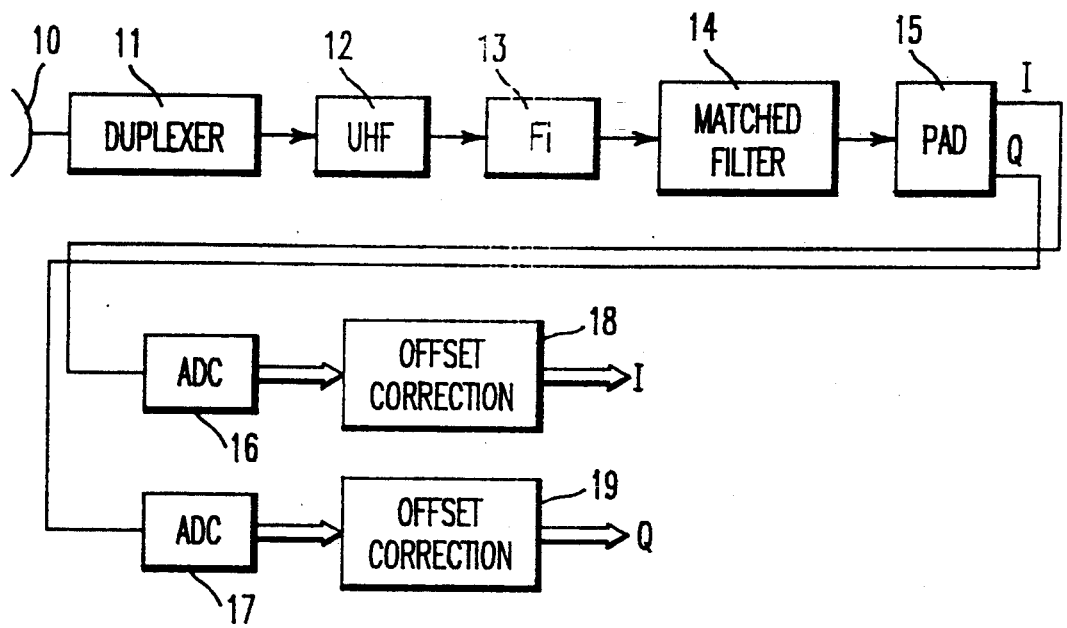
FIG. 1 is a diagram of a standard radar reception system implementing analog/digital converters in video band.

The radar reception system shown in FIG. 1 is coupled with a radar transmission system (not shown) to a radar antenna 10 by means of a duplexer 11. It starts with a microwave stage 12 essentially constituted by a low-noise amplifier. This microwave stage (UHF) 12 is followed by an intermediate frequency stage (Fi) 13 containing a first demodulator that transfers the received signal from the microwave band to a high frequency band of some tens of megahertz. The intermediate frequency stage 13 leads to a matched filter 14 and then to a demodulator in quadrature or phase-amplitude demodulator (PAD) 15 whose video outputs in phase and quadrature are connected to the inputs of two analog/digital converters (ADC) 16, 17 each followed by a zero offset correction circuit 18, 19.

The conversion into the digital mode of the signal received by the radar reception system is done here only at the level of the video signal to reduce the conversion frequency to the maximum extent. However, it is not possible to prevent a situation where imperfections in the construction of the analog demodulator in quadrature and of the analog-digital converters generate parasitic d.c. components in the digitized phase and quadrature components of the video signal, these parasitic d.c. evolving as a function of various parameters such as temperature, supply voltages and the frequency of the transmission carrier. To remove these parasitic d.c components, it is common practice to make use of zero offset correction circuits which determine their amplitudes by an operation to take the mean values of the noise received during a radar silence and which deduct them from the output signals of the analog-digital converters. These zero offset correction circuits have the drawback of being digital circuits with a relative complex structure and a high cost price. Furthermore, the obligation of providing for periods of radar silence for their operation reduces the operational time of the radar and makes it vulnerable to jamming.

Figure 2:
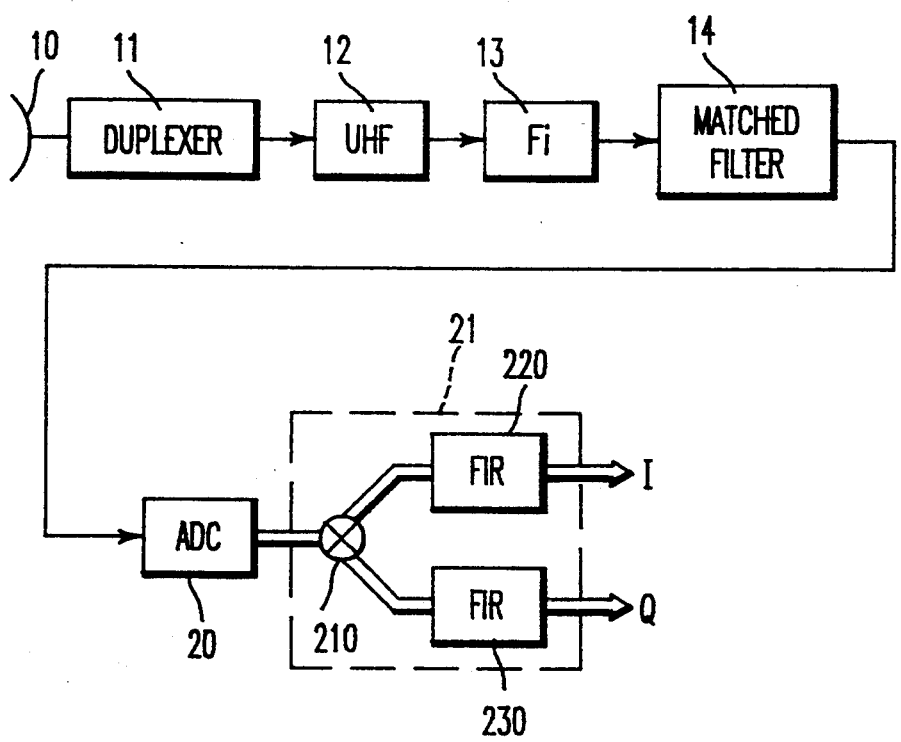
FIG. 2 is a diagram of a more modern radar reception system implementing an analog/digital converter in intermediate frequency band.

The radar reception system shown in FIG. 2 makes it possible to avoid the imperfections due to an analog structure of the demodulator in quadrature by going into the digital mode as soon as the output of the intermediate frequency stage is reached.

As above, this radar reception system is coupled with a radar transmission system (not shown) to a radar antenna 10 by means of a duplexer 11 and comprises, at input, a microwave stage 12 followed by an intermediate stage (Fi) 13 and a matched filter 14. However, at the output of the matched filter, there is an analog-digital converter (ADC) 20 that precedes a digital demodulator in quadrature 21 formed by a double multiplier 210 multiplying the output digital samples of the analog-digital converter 20 by sine $2\pi f_i t$ and cos $2\pi f_i t$, $f_i$ being the intermediate carrier frequency, and two finite impulse response low-pass digital filters (FIR) 220 and 230 eliminating the higher beats.

The radar reception signal Y(t) at output of the matched filter 14 takes the form of a video signal S(t) modulating a carrier at intermediate frequency $f_i$:

$$Y(t) = S(t) \exp(-j 2\pi f_i t)$$

Figure 3:
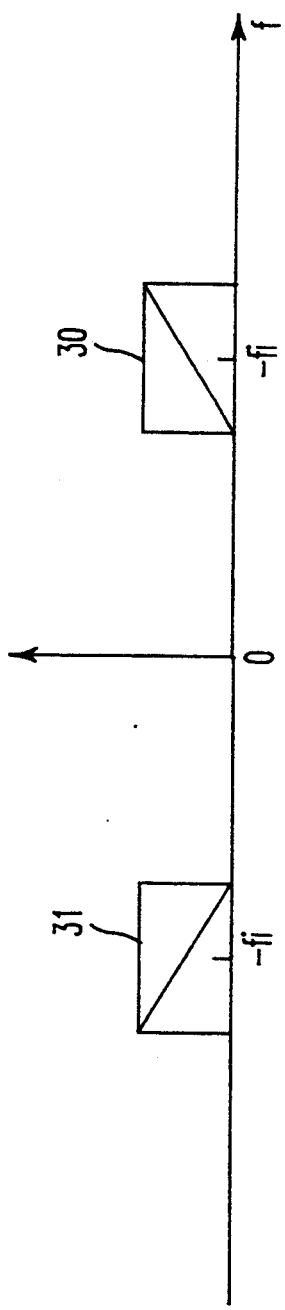
FIGS. 3, 4, 5 and 6 are graphs illustrating the spectra of frequency of the signals available at various points of the radar reception system shown in FIG. 2.

As shown in FIG. 3, it has a frequency spectrum with a component 30 in a band centered on the frequency $f_i$ in the domain of the positive frequencies and an image component 31 centered on the frequency $-f_i$ in the domain of the negative frequencies.

After having passed through the analog-digital converter 20 where it is sampled at the frequency Fe, the radar reception signal becomes $$Y(k) = S(k)\exp\left(-j2\pi \frac{f_i}{Fe} k\right)$$

If we choose:

$$f_i = Fe(n \pm \tfrac{1}{4})$$

n being a whole number, we get:

$$Y(k) = S(k)\exp\left(\pm j\frac{\pi}{2} k\right)$$

This simplifies the multiplier 21: all that it has to do now is to carry out multiplications by sine $\pm\pi/2$, sine $\pm\pi$ for the component in phase and cos $\pm\pi/2$ and cos $\pm\pi$ in component in quadrature.

Figure 4:
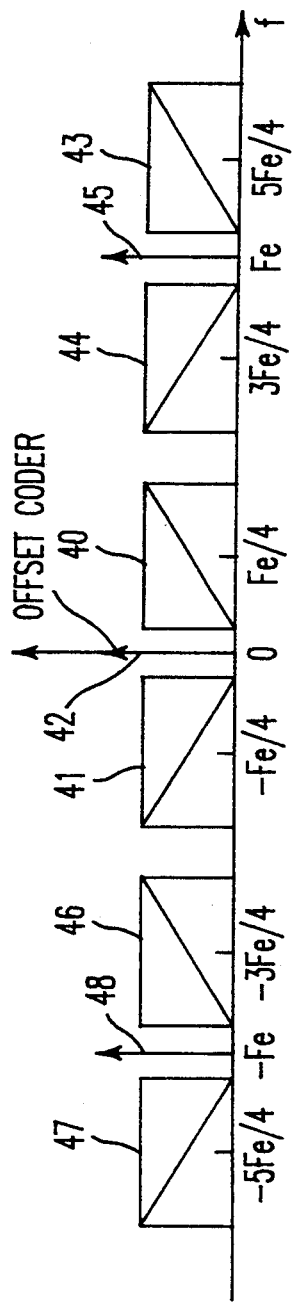

FIG. 4 shows the frequency spectrum of the signal at the output of the analog-digital converter which should there be:

$$f_i = Fe \times \tfrac{1}{4}$$

Two symmetrical components 40, 41 are found, one centered on the frequency Fe/4 and the other on the frequency −Fe/4 with a d.c. parasitic line 42 due to the offset voltage of the analog-digital converter and their replicas 43, 44, 45 and 46, 47, 48, centered on the frequencies Fe and −Fe.

Figure 5:
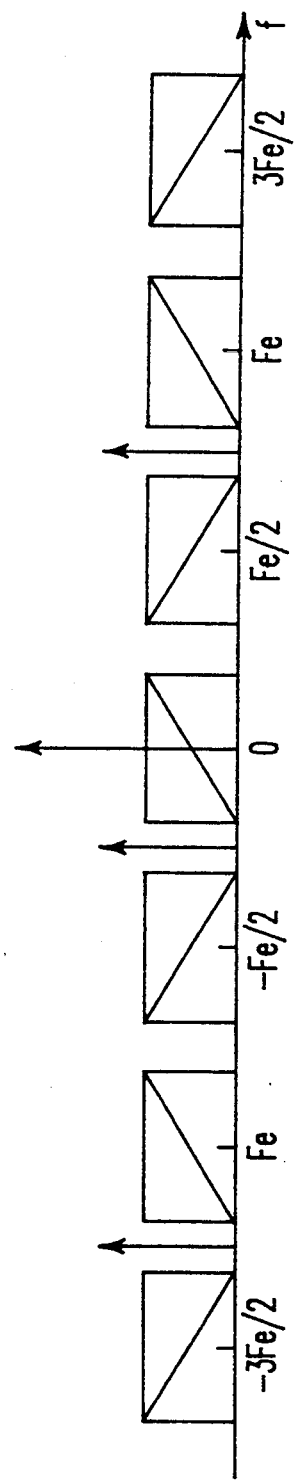

FIG. 5 represents the frequency spectrum of the output signals of the multiplier 21 which is deduced from the frequency spectrum of the input signal of the multiplier 21 by a translation of Fe/4.

Figure 6:
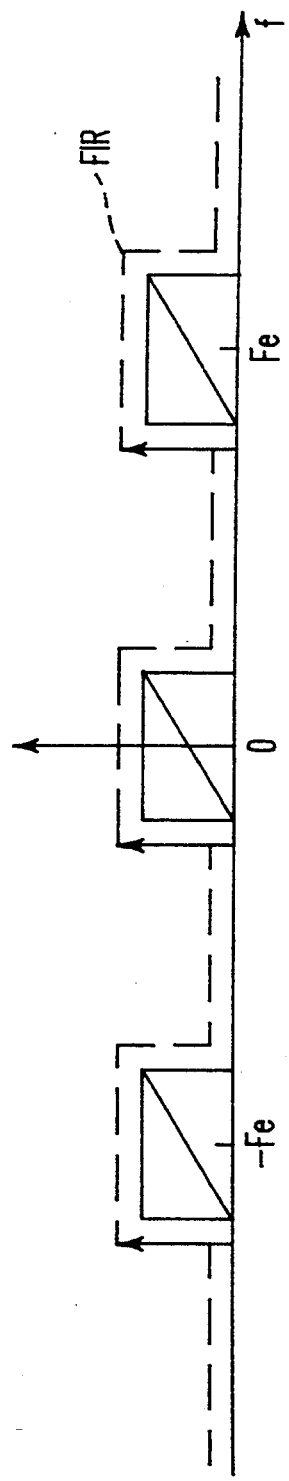

FIG. 6 shows the frequency spectrum of the output signal of the digital filters 220 and 230 which eliminate the replicas centered on the frequencies −Fe/2, Fe/2, 3Fe/2. It is seen that the parasitic component due to the offset voltage of the analog-digital converter 20 is recovered at the end of the useful band, for the digital filters 220 and 230 do not have an infinitely steep cut-off. It is therefore necessary to eliminate this parasitic component. This can be done by means of a prior art offset voltage correction circuit placed at output of the analog-digital converter or more advantageously by using, as an analog-digital converter, the analog-digital coding circuit with automatic compensation for the zero offset shown in FIG. 7.

This analog-digital coding circuit comprises:

- an analog-digital converter (ADC) 50 having one analog data input connected to the analog input of the coding circuit and one output of digital samples with n parallel bits and converting an input parallel signal into a sequence of digital samples with a conversion time to;
- a crossover detection circuit 51 working on the input analog signal of the analog-digital converter 50 and delivering, at output, a binary signal, one state of which represents a crossover while the other state does not;
- a delay circuit 52 positioned after the crossover detector 51, the output binary signal of which it delays by the conversion time to;
- a digital register (R) 53 with one digital data input connected to the digital data output of the analog-digital converter 50, one memorizing control input connected to the output of the delay circuit 52 and sensitive to the binary state of this output signal that represents a crossover, and a digital data output; and
- a digital subtractor 54 with a digital data additive input connected to the digital data output of the analog-digital converter 50, a subtractive digital data input connected to the digital data output of the digital register 53 and a digital data output constituting the output of the analog-digital coding circuit.

The crossover detector 51 is used to detect the instants at which the input analog signal of the analog-digital converter 50 takes on a voltage amplitude, in terms of absolute value, that is smaller than the quantum corresponding to the least significant digit of the digital output of the analog-digital converter 50 for, at these instants, the analog-digital converter 50 delivers a digital value corresponding to its offset voltage. The delay circuit 52 is used to take account of the conversion time to of the analog-digital converter 50 for the memorizing, in the digital register 53, of the digital values delivered by the analog-digital converter 50 effectively corresponding to the offset voltage of this converter. The digital subtractor 54 enables the systematic deduction, from all the digital samples delivered by analog-digital converter 50, of the last measured value of its offset voltage.

With the analog-digital circuit that has just been described, it is no longer necessary to make provision, in a radar reception system, for particular stimuli such as radar silences to correct the disturbing effects of the offset voltage and it becomes possible to avoid the practice of resorting to complex digital circuits to obtain mean values on the noise received during radar silences.

Figure 7:
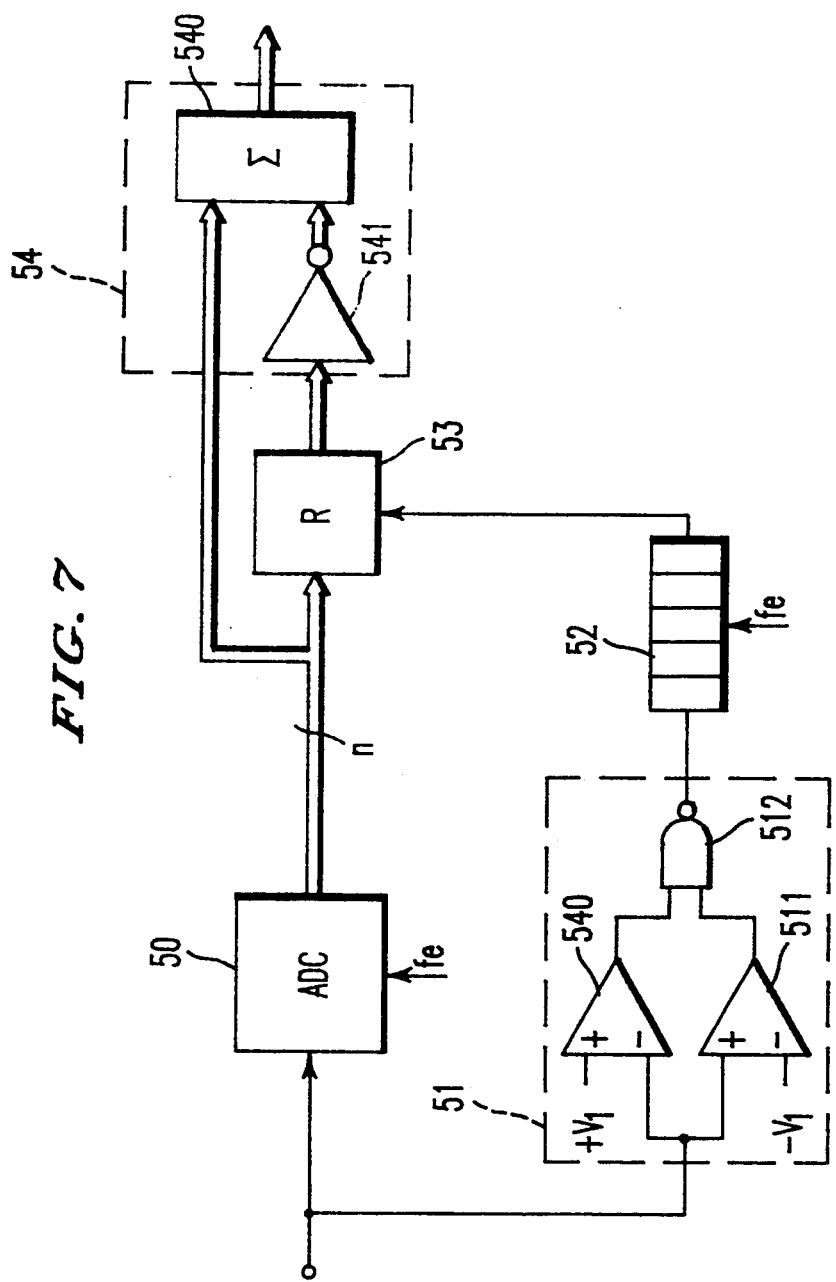
FIG. 7 shows a diagram of an analog/digital encoding circuit with automatic compensation of the zero offset according to the invention.

The crossover detector 51 can be set up, as shown in FIG. 7, by means of two comparators 510, 511 and one NAND type logic gate 512. In the case of a positive logic having the positive bias assigned to the logic level 1, and a digital register 53 having an active memorization command at the logic level 0, the first comparator 510 may have its additive input taken to a positive reference voltage $+V_1$ lower than or equal to the quantum corresponding to the least significant digit of the output of the analog-digital converter 50 and its subtractive input connected to the analog data input of the analog data converter 50, while the second comparator 511 may have its additive input connected to the analog data input of the analog-digital converter 50 and its subtractive input taken to a voltage reference $-V_1$. The two comparators 510, 511 then have their outputs which go simultaneously to a positive voltage or to the logic level 1 only when the voltage at the analog data input of the analog-digital converter 50 is in the range of $\pm V_1$, i.e. smaller in absolute value than the quantum of voltage corresponding to the least significant digit of this ADC 50. These two logic levels 1, applied to the inputs of the NAND type logic gate 512, lead to the appearance, at output of this gate, of a logic level 0 which is then characteristic of the crossovers of the analog data input of the analog-digital converter 50.

The delay circuit 52 may be an offset register with its rate set by a sampling frequency $f_e$ of the analog-digital converter 50. In FIG. 7, it was assumed that there were five stages, i.e. that the conversion time to of the analog-digital converter 50 corresponded to a duration of five sampling periods.

The subtractor circuit 54 may be constituted, as shown, by a digital adder 540 with two inputs, one of which is preceded by a sign inverter 541.

What is claimed is:

1. An analog-digital coding circuit with automatic compensation for the zero offset that works with an input analog signal having passages through zero, each passage through zero being a crossover, comprising:

an analog-digital converter having an analog data input and a digital data output, said analog-digital converter converting said input analog signal into a sequence of digital samples with a conversion time to;

a crossover detector operating on said input analog signal and delivering an output binary signal, one state of said output binary signal representing a crossover while the other state of said output binary signal does not represent a crossover;

a delay circuit positioned after the crossover detector, said output binary signal being delayed by said delay circuit by the conversion time to;

a digital register having a digital data input connected to the digital data output of the analog-digital converter, a memorizing control input connected to the output of the delay circuit and sensitive to the binary state of said output binary signal representing a crossover, and a digital data output; and a digital subtractor having an additive input of digital data connected to the digital data output of the analog-digital converter, a subtractive input of digital data connected to the digital data output of the digital register, and a digital data output comprising the output of the analog-digital coding circuit.

2. The analog-digital circuit according to claim 1, wherein the crossover detector comprises two comparators, one of said two comparators having a positive voltage threshold and the other of said two comparators having a negative voltage threshold, the voltage thresholds being, in terms of absolute value, lower than or equal to the quantum of voltage corresponding to the least significant digit of digital data output from the analog-digital converter, and comprising a logic gate combining the output states of the two comparators so as to make a particular logic level correspond to the crossovers of said input analog signal.

3. The analog-digital circuit according to claim 1, wherein the delay circuit comprises a shift register shifted at the rate of a sampling frequency of the analog-digital converter.

4. The analog-digital circuit according to claim 1, wherein the digital subtractor comprises a digital adder with two inputs, one of said two inputs being preceded by a sign inverter.

* * * * *